(12) United States Patent
Jin et al.

(10) Patent No.: US 10,361,397 B2
(45) Date of Patent: Jul. 23, 2019

(54) FLEXIBLE ORGANIC LIGHT EMITTING DIODE DISPLAY HAVING LAYER PROVIDED WITH A BENZENE RING BOND

(71) Applicant: WUHAN CHINA STAR OPTOELECTRONICS TECHNOLOGY CO., LTD., Wuhan (CN)

(72) Inventors: Jiangjiang Jin, Wuhan (CN); Hsianglun Hsu, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 15/570,344

(22) PCT Filed: Jun. 22, 2017

(86) PCT No.: PCT/CN2017/089613
§ 371 (c)(1),
(2) Date: Oct. 29, 2017

(87) PCT Pub. No.: WO2018/209756
PCT Pub. Date: Nov. 22, 2018

(65) Prior Publication Data
US 2019/0067637 A1    Feb. 28, 2019

(30) Foreign Application Priority Data
May 16, 2017    (CN) .......................... 2017 1 0344087

(51) Int. Cl.
*H01L 29/00*    (2006.01)
*H01L 51/40*    (2006.01)
(Continued)

(52) U.S. Cl.
CPC ...... *H01L 51/5256* (2013.01); *H01L 27/3244* (2013.01); *H01L 51/0097* (2013.01);
(Continued)

(58) Field of Classification Search
CPC ............. H01L 51/5256; H01L 27/3244; H01L 51/0097; H01L 51/5253; H01L 51/56
See application file for complete search history.

(56) References Cited

U.S. PATENT DOCUMENTS

| 9,748,518 B2 | 8/2017 | Zeng et al. |
| 2016/0053116 A1* | 2/2016 | Eguchi ....................... C08J 5/18 428/333 |

(Continued)

FOREIGN PATENT DOCUMENTS

| CN | 103996799 A | 8/2014 |
| CN | 105118933 A | 12/2015 |
| KR | 10-2011-0000818 A | 1/2011 |

*Primary Examiner* — Alonzo Chambliss
(74) *Attorney, Agent, or Firm* — Soroker Agmon Nordman (57) ABSTRACT

A flexible organic light emitting diode display and a method for manufacturing the same are provided. The flexible organic light emitting diode display includes sequentially forming an organic light emitting display layer, a first inorganic layer, a first dative bond layer, a polymer organic layer, and a second inorganic layer on a flexible substrate; the first dative bond layer is configured to provide an electron-rich group; the polymer organic layer has an electron-deficient group, the electron-deficient group and the electron-rich group commonly form a dative bond.

20 Claims, 4 Drawing Sheets

(51) Int. Cl.
*H01L 51/52* (2006.01)
*H01L 27/32* (2006.01)
*H01L 51/00* (2006.01)
*H01L 51/56* (2006.01)

(52) U.S. Cl.
CPC .......... *H01L 51/5253* (2013.01); *H01L 51/56* (2013.01); *H01L 2251/301* (2013.01); *H01L 2251/5338* (2013.01); *H01L 2251/558* (2013.01)

(56) References Cited

U.S. PATENT DOCUMENTS

2018/0034003 A1* 2/2018 Oh .......................... H01L 51/56
2018/0331302 A1* 11/2018 Pan ..................... H01L 51/0072

* cited by examiner

FLEXIBLE ORGANIC LIGHT EMITTING DIODE DISPLAY HAVING LAYER PROVIDED WITH A BENZENE RING BOND

CROSS REFERENCE TO RELATED APPLICATIONS

This application is a U.S. National Phase application submitted under 35 U.S.C. § 371 of Patent Cooperation Treaty Application serial No. PCT/CN2017/089613, filed on Jul. 22, 2017, which claims the priority of China Patent Application serial No. 201710344087.8, filed on May 16, 2017, the disclosures of which are incorporated herein by reference.

FIELD OF THE INVENTION

The present invention relates to display technologies, and more particularly to a flexible organic light emitting diode display and a method of manufacturing the same.

BACKGROUND OF THE INVENTION

Compared with liquid crystal displays, active matrix organic light-emitting diodes (AMOLEDs) have characteristics such as a higher contrast, a wider viewing angle, a faster response time, etc. Moreover, AMOLEDs have self-luminous characteristics without use of a backlight module, thus liquid crystal display panels are thinner, and since no backlight module is used, production costs can also be reduced.

However, water molecules can easily enter a flexible OLED display, and will affect performance of the OLED, and the flexible OLED is prone to breakage during bending. In order to block the moisture in the air and prevent breakage during bending, it is necessary to apply a passivation layer having a lower water vapor transmission rate (WVTR) on the flexible OLED, where the transmittance is generally required to be less than $10^{-6}$ g/m$^2$d at 85° C. and 85RH. In order to obtain a passivation layer with a sufficiently low transmittance, in general, the passivation layer usually is made of an inorganic material such as silicon oxide ($SiO_x$), silicon nitride ($SiN_x$), alumina ($Al_2O_3$), and the like.

However, this kind of material made of an inorganic layer easily peels off from the organic layer during the bending.

Therefore, it is necessary to provide a flexible organic light emitting diode display and method of manufacturing the same to solve the problems of the present technology.

SUMMARY OF THE INVENTION

An object of the present invention is to provide a flexible organic light emitting diode display and a method of manufacturing the same, with which it is possible to prevent the inorganic layer from being peeled off from the organic layer during bending.

In order to solve the above technical problems, the present invention provides a manufacturing method of a flexible organic light emitting diode display, which comprises steps of:

forming an organic light emitting display layer on a flexible substrate;

forming a first inorganic layer on the organic light emitting display layer, wherein the first inorganic layer is made of metallic oxide or non-metallic oxide;

forming a first dative bond layer on the first inorganic layer, wherein the first dative bond layer is configured to provide an electron-rich group which is a π bond of a benzene ring;

forming a polymer organic layer on the first dative bond layer, wherein the polymer organic layer has an electron-deficient group, the electron-deficient group and the electron-rich group commonly form a dative bond, and the electron-deficient group includes a structure of $R_1$—CO—$R_2$, wherein each of the $R_1$ and $R_2$ is a heterocyclic carbon chain or a miscellaneous chain group, wherein miscellaneous elements thereof comprise at least one of B, O, S, Si, P, N, F, Cl, and B; and forming a second inorganic layer on the polymer organic layer.

In one embodiment, the manufacturing method of the flexible organic light emitting diode display according to present invention, the step of forming the first dative bond layer on the first inorganic layer comprises: forming the first dative bond layer on the first inorganic layer by using polyphosphoric acid.

Moreover, the manufacturing method of the flexible organic light emitting diode display according to present invention, further comprises steps of:

forming a second dative bond layer on the second inorganic layer;

forming a first organic layer on the second dative bond layer; and forming a third inorganic layer on the first organic layer.

In one embodiment, the manufacturing method of the flexible organic light emitting diode display according to present invention, a thickness of the first inorganic layer ranges from 0.5 μm to 1 μm.

In another embodiment, the manufacturing method of the flexible organic light emitting diode display according to present invention, a thickness of the polymer organic layer ranges from 1 μm to 12 μm.

In yet another embodiment, the manufacturing method of the flexible organic light emitting diode display according to present invention, the second inorganic layer is made of at least one of zirconium aluminate, graphene, alumina, zirconium dioxide, zinc peroxide, silicon nitride, silicon carbonitride, $SiO_x$, titanium dioxide, and diamond-like carbon.

An object of the present invention is to provide a manufacturing method of flexible organic light emitting diode display, and the method comprises steps of:

forming an organic light emitting display layer on a flexible substrate;

forming a first inorganic layer on the organic light emitting display layer;

forming a first dative bond layer on the first inorganic layer, wherein the first dative bond layer is configured to provide an electron-rich group;

forming a polymer organic layer on the first dative bond layer, wherein the polymer organic layer has an electron-deficient group, and the electron-deficient group and the electron-rich group commonly form a dative bond; and forming a second inorganic layer on the polymer organic layer.

In one embodiment, the manufacturing method of the flexible organic light emitting diode display according to present invention, the electron-rich group is a π bond of a benzene ring, the electron-deficient group comprises a structure of $R_1$—CO—$R_2$, wherein each of the $R_1$ and $R_2$ is a heterocyclic carbon chain or a miscellaneous chain group, wherein miscellaneous elements thereof comprise at least one of B, O, S, Si, P, N, F, Cl, and B.

In another embodiment, the manufacturing method of the flexible organic light emitting diode display according to present invention, the step of forming the first dative bond layer on the first inorganic layer comprises: forming the first dative bond layer on the first inorganic layer by using polyphosphoric acid.

Furthermore, the manufacturing method of the flexible organic light emitting diode display according to present invention, further comprises steps of:

forming a second dative bond layer on the second inorganic layer;

forming a first organic layer on the second dative bond layer; and forming a third inorganic layer on the first organic layer.

In one embodiment, the manufacturing method of the flexible organic light emitting diode display according to present invention, the first inorganic layer is made of metallic oxide or non-metallic oxide.

In another embodiment, the manufacturing method of the flexible organic light emitting diode display according to present invention, a thickness of the first inorganic layer ranges from 0.5 μm to 1 μm.

In yet another embodiment, the manufacturing method of the flexible organic light emitting diode display according to present invention, a thickness of the polymer organic layer ranges from 1 μm to 12 μm.

In one embodiment, the manufacturing method of the flexible organic light emitting diode display according to present invention, the second inorganic layer is made of at least one of zirconium aluminate, graphene, alumina, zirconium dioxide, zinc peroxide, silicon nitride, silicon carbonitride, $SiO_x$, titanium dioxide, and diamond-like carbon.

An object of the present invention is to provide a flexible organic light emitting diode display, and comprises:

a flexible substrate;

an organic light emitting display layer formed on the flexible substrate;

a first inorganic layer formed on the organic light emitting display layer;

a first dative bond layer formed on the first inorganic layer, wherein the first dative bond layer is configured to provide an electron-rich group;

a polymer organic layer formed on the first dative bond layer, wherein the polymer organic layer has an electron-deficient group, and the electron-deficient group and the electron-rich group commonly form a dative bond; and a second inorganic layer formed on the polymer organic layer.

In one embodiment, the flexible organic light emitting diode display according to present invention, the electron-rich group is a π bond of a benzene ring, the electron-deficient group includes a structure of $R_1$—CO—$R_2$, wherein each of the $R_1$ and $R_2$ is a heterocyclic carbon chain or a miscellaneous chain group, wherein miscellaneous elements thereof comprise at least one of B, O, S, Si, P, N, F, Cl, and B.

Moreover, the flexible organic light emitting diode display according to present invention, further comprises:

a second dative bond layer formed on the second inorganic layer;

a first organic layer formed on the second dative bond layer; and a third inorganic layer formed on the first organic layer.

In one embodiment, the flexible organic light emitting diode display according to present invention, the first inorganic layer is made of metallic oxide or non-metallic oxide.

In another embodiment, the flexible organic light emitting diode display according to present invention, a thickness the first inorganic layer ranges from 0.5 μm to 1 μm.

In yet another embodiment, the flexible organic light emitting diode display according to present invention, a thickness of the polymer organic layer ranges from 1 μm to 12 μm.

The flexible organic light emitting diode display and the method of manufacturing the same according to present invention add a dative bond layer between the inorganic layer and the organic layer, the electron-rich group of the dative bond layer and the electron-deficient layer of the organic layer form a reinforcing dative bond, thereby enhancing the adhesion between the inorganic layer and the organic layer, and improving the reliability of the flexible organic light emitting diode display.

DETAILED DESCRIPTION OF THE PREFERRED EMBODIMENTS

The structure and the technical means adopted by the present invention to achieve the above and other objects can be best understood by referring to the following detailed description of the preferred embodiments and the accompanying drawings. Furthermore, directional terms described by the present invention, such as upper, lower, front, back, left, right, inner, outer, side, longitudinal/vertical, transverse/horizontal, etc., are only directions by referring to the accompanying drawings, and thus the used directional terms are used to describe and understand the present invention, but the present invention is not limited thereto.

Figure 1:
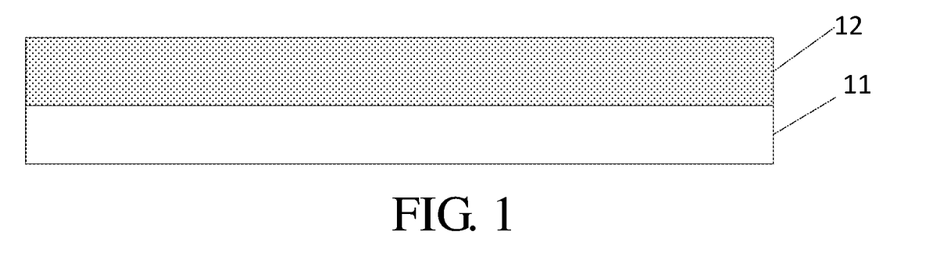
FIG. 1 is a schematic diagram of a first step of a method of manufacturing a flexible organic light emitting diode display.

Refer now to FIG. 1, which is a schematic diagram of a first step of the method of manufacturing a flexible organic light emitting diode display.

The method of manufacturing a flexible organic light emitting diode display according to the present invention, comprises:

Step S101, forming an organic light emitting display layer on a flexible substrate.

As illustrated in FIG. 1, an organic light emitting display layer 12 is formed on a flexible substrate 11, and the organic light emitting display layer 12 has a plurality of organic light emitting units. The organic light emitting display layer 12 includes an anode, a hole transport layer, a hole injection layer, a light emitting layer, an electron transport layer, an electron injection layer, and a cathode.

Step S102, forming a first inorganic layer on the organic light emitting display layer.

Figure 2:
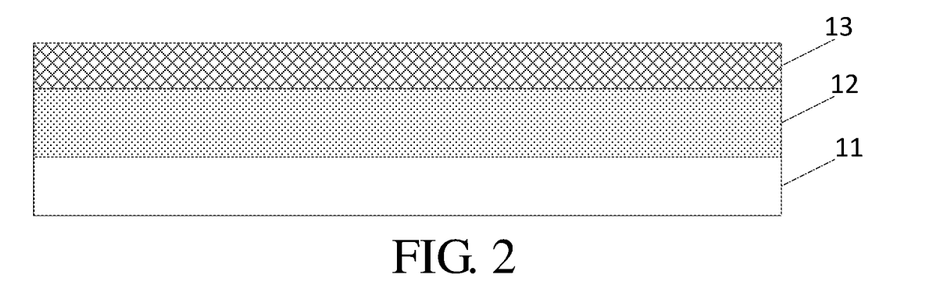
FIG. 2 is a schematic representation of a second step of the method of manufacturing the flexible organic light emitting diode display.

As illustrated in FIG. 2, an inorganic material is deposited on the organic light emitting display layer 12 by using one of the methods such as atomic layer deposition (ALD), pulsed laser deposition (PLD), sputtering, and plasma enhanced chemical vapor deposition (PECVD), thereby forming the first inorganic layer 13. In this embodiment, the material of the first inorganic layer 13 is made of metal oxide or non-metal oxide. The first inorganic layer 13 is configured to block water and oxygen from an external environment.

Thickness of the first inorganic layer 13 ranges from 0.5 μm to 1 μm. When the thickness is within this range, the first inorganic layer 13 can better block water and oxygen from the external environment, and will not increase thickness of the display.

Step S103, forming a first dative bond layer on the first inorganic layer; the first dative bond layer is configured to provide an electron-rich group.

Figure 3:
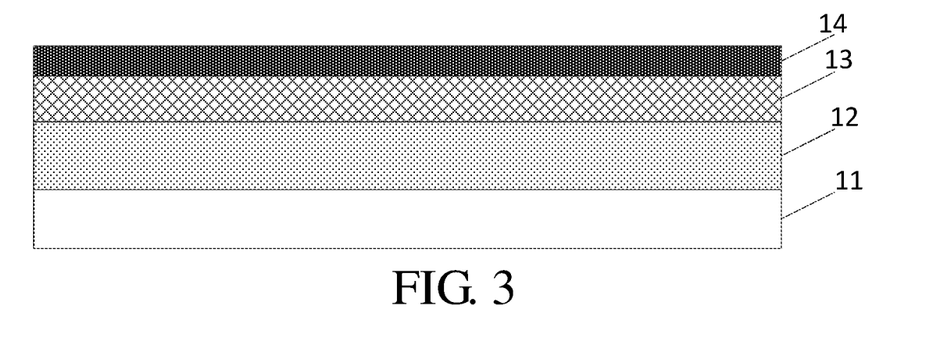
FIG. 3 is a schematic representation of a third step of the method of manufacturing the flexible organic light emitting diode display.

As illustrated in FIG. 3, a first bond layer 14 is formed on the first inorganic layer 13 using polyphosphoric acid (PPA). The first bonding layer 14 is configured to provide an electron-rich group; the electron-rich group is a π bond of a benzene ring.

Figure 4:
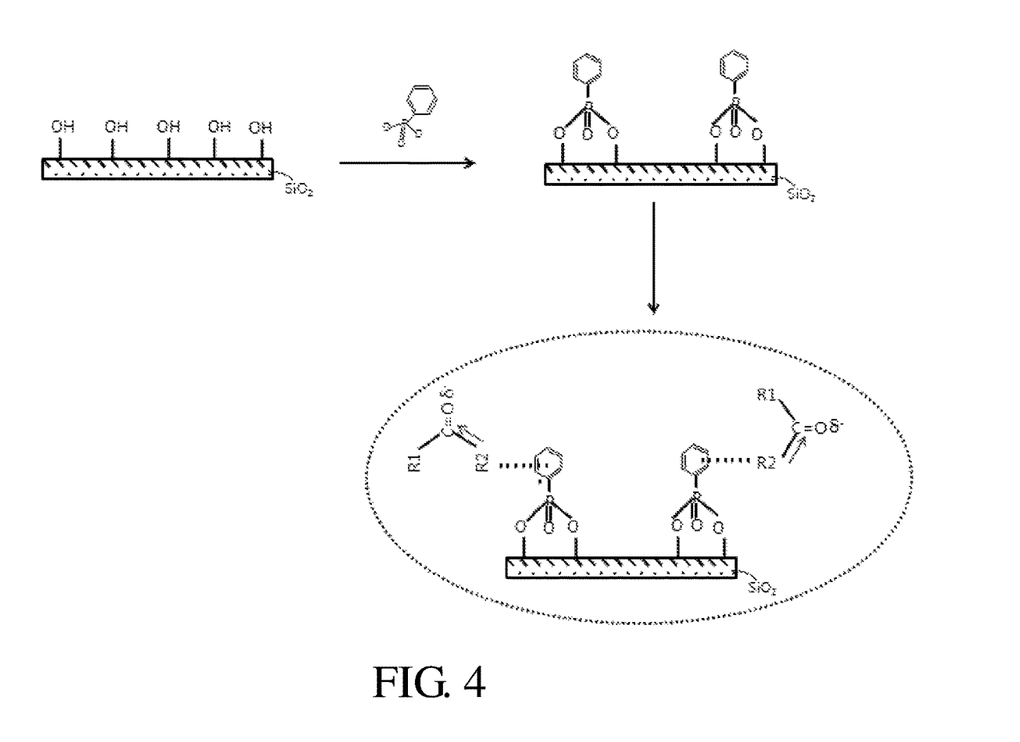
FIG. 4 shows function among the bonding layer and the $SiO_2$ and the polymer organic layer in the flexible organic light emitting diode display according to the present invention.

In an exemplary example using $SiO_2$, as illustrated in the upper part of FIG. 4, the upper surface of $SiO_2$ is modified by the polyphosphoric acid benzene ring, thereby $SiO_2$-Ph is formed. Since the surface of $SiO_2$ contains OH groups, the molecules of OH will have a chemical reaction with PPA, then PPA will be connected to the $SiO_2$ by a chemical bond, and result in the formation of $SiO_2$-Ph layer. The benzene ring in the $SiO_2$-Ph will form a dative bond when the benzene ring is in contact with the polymer organic layer.

Step S104, forming a polymer organic layer on the first dative bond layer; the polymer organic layer has an electron-deficient group, the electron-deficient group and the electron-rich group commonly form a dative bond.

Figure 5:
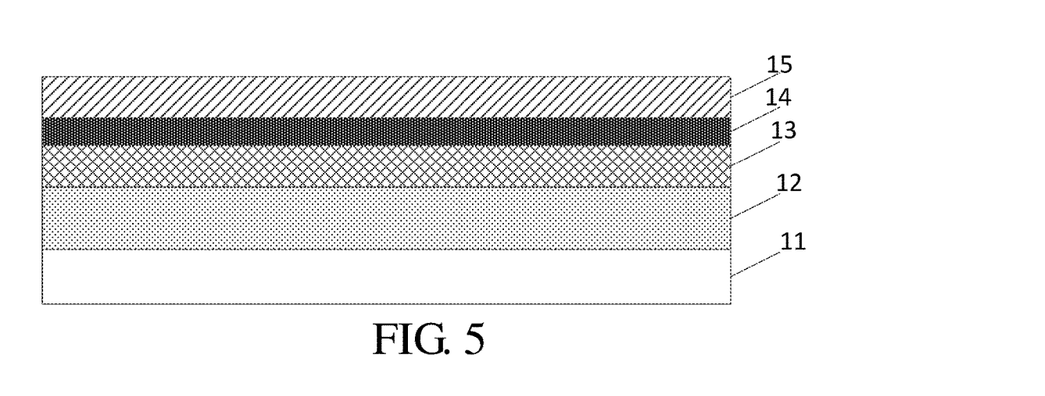
FIG. 5 is a schematic representation of a fourth step of the method of manufacturing the flexible organic light emitting diode display.

As illustrated in FIG. 5, a layer of polymer material is coated on the first bond layer 14 by using one of the methods such as inkjet printing (IJP), PECVD, spin-coating, slot coating, screen printing, and dispenser, thereby forming the polymer organic layer 15. Moreover, the polymer includes a structure of $R_1$—CO—$R_2$, wherein each of the $R_1$ and $R_2$ is a heterocyclic carbon chain or a miscellaneous chain group, wherein miscellaneous elements thereof comprise at least one of B, O, S, Si, P, N, F, Cl, and B. That is, the electron-deficient group includes a structure of $R_1$—CO—$R_2$. As illustrated in the lower part of FIG. 4, the benzene ring which is provided on SiO2-Ph forms a dative bond with the polymer organic layer which it is in contact with, it also forms a stronger dative bond between the electron-deficient group on $R_1$—CO—$R_2$ and the π bond on the benzene ring, thereby enhancing the adhesion between the inorganic layer and the organic layer.

The polymer organic layer 15 is mainly used for buffering stress and blocking external particulate contaminants. The polymer organic layer 15 has a thickness ranging from 1 μm to 12 μm. Since the thickness is within this range, the organic light emitting display layer can be better protected and the thickness of the display is not increased.

Since the polymer organic layer 15 contains the $R_1$—CO—$R_2$ structure, the C=O bond has a stronger property of electron-withdrawing, which causes the $R_1$ or $R_2$ groups adjacent to C=O to exhibit a lack of electron properties, and the six π electrons on the benzene ring have a property of electron repelling, which will form a stronger dative bond between the $R_1$ or $R_2$ group and the benzene ring, thereby enhancing the interaction between the organic layer and the inorganic layer, and preventing the phenomenon of peeling during bending and folding.

Step S105, forming a second inorganic layer on the polymer organic layer.

Figure 6:
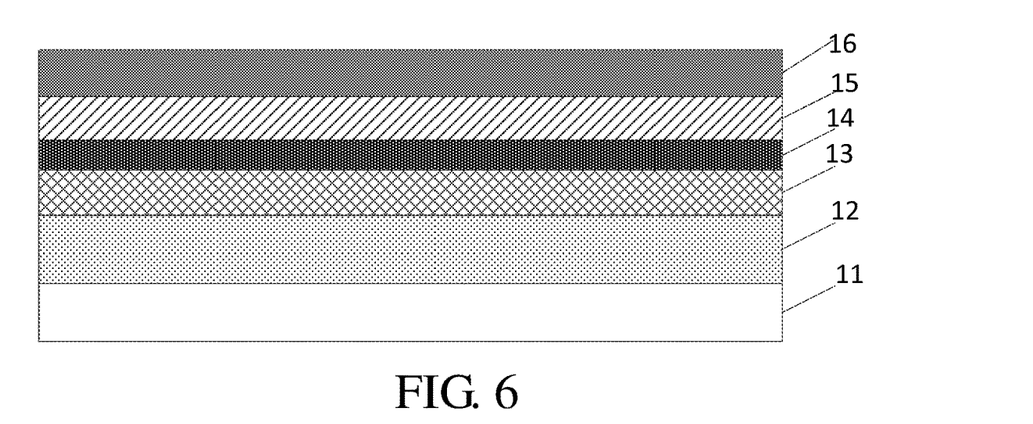
FIG. 6 is a schematic representation of a fifth step of the method of manufacturing the flexible organic light emitting diode display.

As illustrated in FIG. 6, an inorganic material is deposited on the polymer organic layer 15 by using one of methods such as atomic layer deposition (ALD), pulsed laser deposition (PLD), sputter, and plasma enhanced chemical vapor deposition (PECVD), thereby forming the second inorganic layer 16. In this embodiment, the second inorganic layer 16 is made of at least one of zirconium aluminate ($ZrAl_xO_y$), graphene, alumina ($Al_2O_3$), zirconium dioxide ($ZrO_2$), zinc peroxide ($ZnO_2$), silicon nitride ($SiN_x$), silicon carbonitride (SiCN), $SiO_x$, titanium dioxide ($TiO_2$), and diamond-like carbon (DLC). Since these materials are insoluble in water and do not react with oxygen, the corrosion resistance is strong, thereby the second inorganic layer 16 has a characteristic of good barrier with water and oxygen, such that the organic light emitting unit can be better prevented from being corroded.

The thickness of the second inorganic layer 16 may be the same as the thickness of the first inorganic layer 13.

Furthermore, the method further comprises:

Step S106, forming a second dative bond layer on the second inorganic layer.

Figure 7:
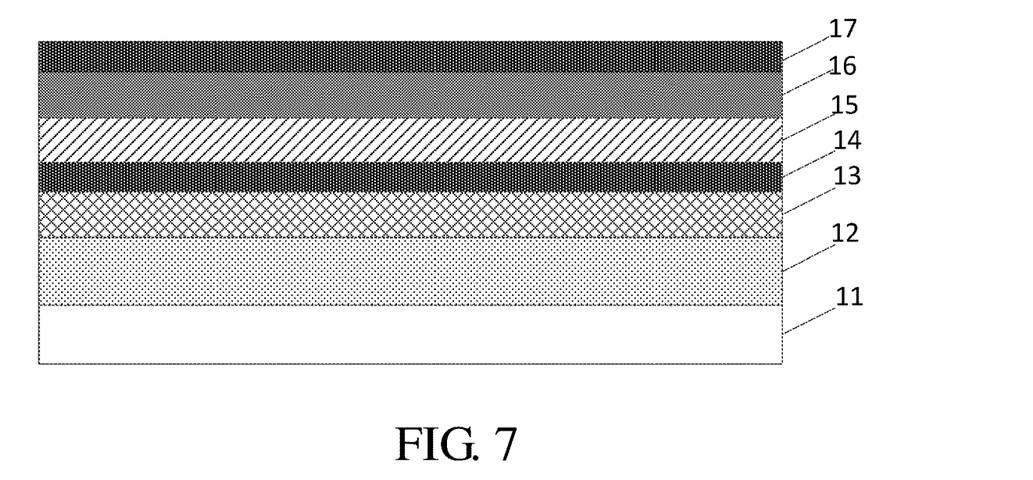
FIG. 7 is a schematic representation of a sixth step of the method of manufacturing the flexible organic light emitting diode display of present invention.

As illustrated in FIG. 7, a second dative bond layer 17 is fabricated on the second inorganic layer 16, and the fabrication process of the second dative bond layer 17 is the same as that of the first dative bond layer 14. Thickness of the second dative bond layer 17 is the same as thickness of the first dative bond layer 14.

Step S107, forming a first organic layer on the second dative bond layer.

Figure 8:
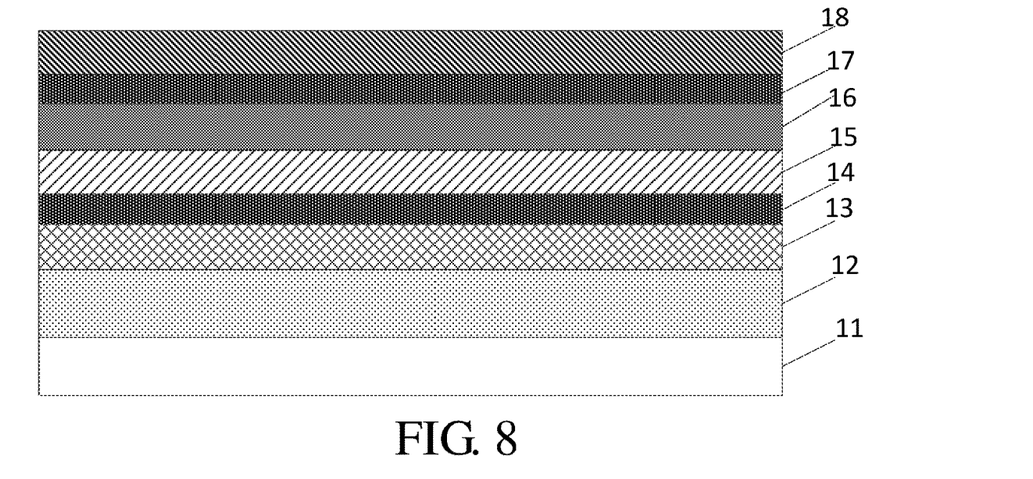
FIG. 8 is a schematic representation of a seventh step of the method of manufacturing the flexible organic light emitting diode display of present invention.

As illustrated in FIG. 8, an organic material is coated on the dative bond layer 17 by using one of methods such as PECVD, IJP, Slot coating, spin-coating, or dispenser, thereby obtaining a first organic layer 18. Fabrication and thickness of the first organic layer 18 are the same as fabrication and thickness of the polymer organic layer 15.

Step S108, forming a third inorganic layer on the first organic layer.

Figure 9:
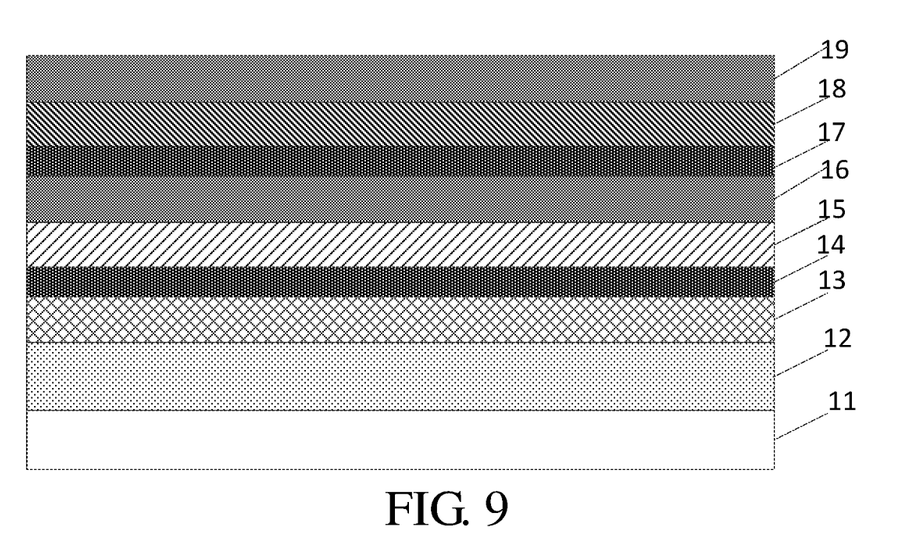
FIG. 9 is a schematic representation of an eighth step of the method of manufacturing the flexible organic light emitting diode display of present invention.

As illustrated in FIG. 9, an inorganic material is coated on the first organic layer 18 by using one of methods such as PECVD, ALD, PLD, or sputter, thereby obtaining a third inorganic layer 19. The fabrication process and the thickness of third inorganic layer 19 is the same as that of the second inorganic layer 16 and first inorganic layer 13.

As illustrated in FIG. 9, an embodiment of present invention of a flexible organic light emitting diode display is provided, which comprises a flexible substrate 11, an organic light emitting display layer 12, a first inorganic layer 13, a first dative bond layer 14, a polymer organic layer 15, and a second inorganic layer 16. The organic light emitting display layer 12 is formed on the flexible substrate 11; the first inorganic layer 13 is formed on the organic light emitting display layer 12; the first dative bond layer 14 is formed on the first inorganic layer 13; the first dative bond layer 14 is configured to provide an electron-rich group; the polymer organic layer 15 is formed on the first dative bond layer 14; the polymer organic layer has an electron-deficient group, and the electron-deficient group and the electron-rich group commonly form a dative bond. The second inorganic layer 16 is formed on the polymer organic layer 15.

The flexible organic light emitting diode display further comprises a second dative bond layer 17, a first organic layer 18, and a third inorganic layer 19. The second dative bond layer 17 is formed on the second inorganic layer 16. The first organic layer 18 is formed on the second dative bond layer 17. The third inorganic layer 19 is formed on the first organic layer 18.

The flexible organic light emitting diode display and the method of manufacturing the same according to present invention add a dative bond layer between the inorganic layer and the organic layer, the electron-rich group of the dative bond layer and the electron-deficient layer of the organic layer form a reinforcing dative bond, thereby enhancing adhesion between the inorganic layer and the organic layer, and improving reliability of the flexible organic light emitting diode display.

In view of the above, although the present invention has been disclosed by way of preferred embodiments, the above-described preferred embodiments are not intended to limit the present invention, and one of ordinary skill in the art will, without departing from the spirit and scope of the invention, the scope of protection of the present invention is defined by the scope of the claims.

What is claimed is:

1. A manufacturing method of a flexible organic light emitting diode display, comprising steps of:
    forming an organic light emitting display layer on a flexible substrate;
    forming a first inorganic layer on the organic light emitting display layer, wherein the first inorganic layer is made of metallic oxide or non-metallic oxide;
    forming a first dative bond layer on the first inorganic layer, wherein the first dative bond layer is configured to provide an electron-rich group which is a π bond of a benzene ring;
    forming a polymer organic layer on the first dative bond layer, wherein the polymer organic layer has an electron-deficient group, the electron-deficient group and the electron-rich group commonly form a dative bond, and the electron-deficient group includes a structure of $R_1$—CO—$R_2$, wherein each of the $R_1$ and $R_2$ is a heterocyclic carbon chain or a miscellaneous chain group, wherein miscellaneous elements thereof comprise at least one of B, O, S, Si, P, N, F, Cl, and B; and
    forming a second inorganic layer on the polymer organic layer.

2. The manufacturing method of the flexible organic light emitting diode display according to claim 1, wherein the step of forming the first dative bond layer on the first inorganic layer comprises: forming the first dative bond layer on the first inorganic layer by using polyphosphoric acid.

3. The manufacturing method of the flexible organic light emitting diode display according to claim 1, further comprising steps of:
    forming a second dative bond layer on the second inorganic layer;
    forming a first organic layer on the second dative bond layer; and
    forming a third inorganic layer on the first organic layer.

4. The manufacturing method of the flexible organic light emitting diode display according to claim 1, wherein a thickness of the first inorganic layer ranges from 0.5 μm to 1 μm.

5. The manufacturing method of the flexible organic light emitting diode display according to claim 1, wherein a thickness of the polymer organic layer ranges from 1 μm to 12 μm.

6. The manufacturing method of the flexible organic light emitting diode display according to claim 1, wherein the second inorganic layer is made of at least one of zirconium aluminate, graphene, alumina, zirconium dioxide, zinc peroxide, silicon nitride, silicon carbonitride, $SiO_x$, titanium dioxide, and diamond-like carbon.

7. A manufacturing method of flexible organic light emitting diode display, comprising steps of:
    forming an organic light emitting display layer on a flexible substrate;
    forming a first inorganic layer on the organic light emitting display layer;
    forming a first dative bond layer on the first inorganic layer, wherein the first dative bond layer is configured to provide an electron-rich group;
    forming a polymer organic layer on the first dative bond layer, wherein the polymer organic layer has an electron-deficient group, and the electron-deficient group and the electron-rich group commonly form a dative bond; and
    forming a second inorganic layer on the polymer organic layer.

8. The manufacturing method of the flexible organic light emitting diode display according to claim 7, wherein the electron-rich group is a π bond of a benzene ring, the electron-deficient group comprises a structure of $R_1$—CO—$R_2$, wherein each of the $R_1$ and $R_2$ is a heterocyclic carbon chain or a miscellaneous chain group, wherein miscellaneous elements thereof comprise at least one of B, O, S, Si, P, N, F, Cl, and B.

9. The manufacturing method of the flexible organic light emitting diode display according to claim 7, wherein the step of forming the first dative bond layer on the first inorganic layer comprises: forming the first dative bond layer on the first inorganic layer by using polyphosphoric acid.

10. The manufacturing method of the flexible organic light emitting diode display according to claim 7, further comprising steps of:
    forming a second dative bond layer on the second inorganic layer;
    forming a first organic layer on the second dative bond layer; and
    forming a third inorganic layer on the first organic layer.

11. The manufacturing method of the flexible organic light emitting diode display according to claim 7, wherein the first inorganic layer is made of metallic oxide or non-metallic oxide.

12. The manufacturing method of the flexible organic light emitting diode display according to claim 7, wherein a thickness of the first inorganic layer ranges from 0.5 μm to 1 μm.

13. The manufacturing method of the flexible organic light emitting diode display according to claim 7, wherein a thickness of the polymer organic layer ranges from 1 μm to 12 μm.

14. The manufacturing method of the flexible organic light emitting diode display according to claim 7, wherein the second inorganic layer is made of at least one of zirconium aluminate, graphene, alumina, zirconium dioxide, zinc peroxide, silicon nitride, silicon carbonitride, $SiO_x$, titanium dioxide, and diamond-like carbon.

15. A flexible organic light emitting diode display, comprising:
   a flexible substrate;
   an organic light emitting display layer formed on the flexible substrate;
   a first inorganic layer formed on the organic light emitting display layer;
   a first dative bond layer formed on the first inorganic layer, wherein the first dative bond layer is configured to provide an electron-rich group;
   a polymer organic layer formed on the first dative bond layer, wherein the polymer organic layer has an electron-deficient group, and the electron-deficient group and the electron-rich group commonly form a dative bond; and
   a second inorganic layer formed on the polymer organic layer.

16. The flexible organic light emitting diode display according to claim 15, wherein the electron-rich group is a π bond of a benzene ring, the electron-deficient group includes a structure of $R_1$—CO—$R_2$, wherein each of the $R_1$ and $R_2$ is a heterocyclic carbon chain or a miscellaneous chain group, wherein miscellaneous elements thereof comprise at least one of B, O, S, Si, P, N, F, Cl, and B.

17. The flexible organic light emitting diode display according to claim 15, further comprising:
   a second dative bond layer formed on the second inorganic layer;
   a first organic layer formed on the second dative bond layer; and
   a third inorganic layer formed on the first organic layer.

18. The flexible organic light emitting diode display according to claim 15, wherein the first inorganic layer is made of metallic oxide or non-metallic oxide.

19. The flexible organic light emitting diode display according to claim 15, wherein a thickness the first inorganic layer ranges from 0.5 μm to 1 μm.

20. The flexible organic light emitting diode display according to claim 15, wherein a thickness of the polymer organic layer ranges from 1 μm to 12 μm.

* * * * *